(12) United States Patent
Benveniste et al.

(10) Patent No.: US 8,183,542 B2
(45) Date of Patent: May 22, 2012

(54) TEMPERATURE CONTROLLED ION SOURCE

(75) Inventors: Victor Benveniste, Lyle, WA (US); Bon-Woong Koo, Andover, MA (US); Shardul Patel, North Reading, MA (US); Frank Sinclair, Quincy, MA (US)

(73) Assignee: Varion Semiconductor Equipment Associates, Inc., Gloucester, MA (US)

( * ) Notice: Subject to any disclaimer, the term of this patent is extended or adjusted under 35 U.S.C. 154(b) by 303 days.

(21) Appl. No.: 12/754,318

(22) Filed: Apr. 5, 2010

(65) Prior Publication Data

US 2011/0240877 A1    Oct. 6, 2011

(51) Int. Cl.
*G21K 5/10* (2006.01)
(52) U.S. Cl. .................. 250/492.1; 250/492.21
(58) Field of Classification Search ............... 250/492.1, 250/492.21, 426; 438/510, 513
See application file for complete search history.

(56) References Cited

U.S. PATENT DOCUMENTS

| | | | | |
|---|---|---|---|---|
| 5,641,707 A | * | 6/1997 | Moslehi | 438/513 |
| 5,707,486 A | * | 1/1998 | Collins | 156/345.49 |
| 5,866,472 A | * | 2/1999 | Moslehi | 438/513 |
| 5,879,574 A | * | 3/1999 | Sivaramakrishnan et al. | 216/60 |
| 5,935,334 A | * | 8/1999 | Fong et al. | 118/723 ME |
| 7,291,545 B2 | * | 11/2007 | Collins et al. | 438/510 |
| 7,479,644 B2 | * | 1/2009 | Ryding et al. | 250/491.1 |
| 7,488,958 B2 | * | 2/2009 | Huang | 250/492.21 |
| 2006/0138353 A1 | * | 6/2006 | Sasaki et al. | 250/492.21 |
| 2009/0014667 A1 | * | 1/2009 | Hahto et al. | 250/492.21 |
| 2010/0055345 A1 | * | 3/2010 | Biloiu et al. | 427/569 |
| 2010/0320395 A1 | * | 12/2010 | Hahto et al. | 250/426 |

* cited by examiner

*Primary Examiner* — Nikita Wells
*Assistant Examiner* — Johnnie L Smith

(57) ABSTRACT

An ion source is provided that utilizes a cooling plate and a gap interface to control the temperature of an ion source chamber. The gap interface is defined between the cooling plate and a wall of the chamber. A coolant gas is supplied to the interface at a given pressure where the pressure determines thermal conductivity from the cooling plate to the chamber to control the temperature of the interior of the chamber.

19 Claims, 6 Drawing Sheets

TEMPERATURE CONTROLLED ION SOURCE

BACKGROUND OF THE INVENTION

1. Field of the Invention

Embodiments of the invention relate to the field of semiconductor device fabrication. More particularly, the present invention relates to an apparatus and method for controlling the temperature of an ion source within an ion implanter utilizing a gas cooling interface.

2. Discussion of Related Art

Ion implantation is a process used to dope impurity ions into a semiconductor substrate. An ion beam is directed from an ion source chamber toward a substrate. The depth of implantation into the substrate is based on the ion implant energy and the mass of the ions generated in the source chamber. A precise doping profile in the substrate is critical to proper device operation. One or more types of ion species may be implanted in different doses and at different energy levels to obtain desired device characteristics. FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 (extraction electrode assembly) and formed into a beam 95 which passes through a mass analyzer magnet 106. The mass analyzer is configured with a particular magnetic field such that only the ions with a desired mass-to-charge ratio are able to travel through the analyzer for maximum transmission through the mass resolving slit 107. Ions of the desired species pass from mass slit 107 through deceleration stage 108 to collimator magnet 110. Collimator magnet 110 is energized to deflect ion beamlets in accordance with the strength and direction of the applied magnetic field to form a ribbon-shaped beam targeted toward a work piece or substrate positioned on support (e.g. platen) 114. In some embodiments, a second deceleration stage 112 may be disposed between collimator magnet 110 and support 114. The ions lose energy when they collide with electrons and nuclei in the substrate and come to rest at a desired depth within the substrate based on the acceleration energy.

An indirectly heated cathode (IHC) ion source is typically used as the ion source chamber 102 in high current applications. FIG. 2 is a cross sectional block diagram generally illustrating an IHC ion source 200 including an arc chamber 201 defined by electrically conductive (e.g. tungsten) chamber walls. The chamber defines an ionization zone within which energy is imparted to a dopant feed gas to generate associated ions. Different feed gases are supplied to the ion source chamber to obtain plasma used to form ion beams having particular dopant characteristics. For example, the introduction of $H_2$, $BF_3$ and $AsH_3$ as the dopant gas at relatively high chamber temperatures are broken down into mono-atoms having high implant energies.

The IHC ion source chamber 200 includes a cathode/filament assembly 230 located at one end of the arc chamber 201. A filament 231 is positioned in close proximity to cathode 232 outside the arc chamber 201. A voltage is supplied to filament 231 which produces enough current through the filament to heat it and cause thermionic emission of electrons. Cathode 232 is indirectly heated via filament 231 by biasing the cathode more positively than the filament which causes these thermo-electrons to accelerate from filament 231 toward cathode 232, thereby heating the cathode 232. A repeller 210 is typically positioned on the opposite end of the arc chamber 201 and is biased to the same voltage as cathode 232. The emitted electrons are confined between the cathode 232 and repeller 210 which collide with the dopant feed gas introduced into the chamber via conduit 212 to generate plasma having the desired properties.

The ions 222 formed from the dopant gas are extracted from source chamber 200 via aperture 220 by way of, for example, a standard three (3) electrode configuration comprising plasma electrode 215, suppression electrode 216 and ground electrode 217 used to create an electric field. Although suppression electrode 216 is shown as being spaced apart from ground electrode 217, this is for illustrative purposes only and the electrodes are physically in contact with each other via insulators. Plasma electrode 215 may be biased at the same large potential as ion source chamber 200. Suppression electrode 216 is connected to a power supply and is typically biased at a moderate negative value to prevent electrons from entering back into source chamber 200. Ground electrode 217 is positioned downstream from suppression electrode 216 and is at ground potential. The strength of the electric field generated by the electrodes can be tuned to a desired beam current to extract a particular type of ion beam from the ions 222 generated in chamber 200.

FIG. 2A is a cross section of ion source 200 taken along lines A-A. Faceplate 262 includes aperture 220 through which beam 222 is extracted using extraction electrode assembly including suppression electrode 216, ground electrode 217 (and plasma electrode) as described above. The arc chamber 201 includes liners 250 disposed along sidewalls 260 and endplate 261. The walls of the chamber and the liners define a gap there between through which dopant gas, supplied via conduit 212, enters the chamber 201. These liners provide a low-cost consumable part that may be replaced as well as providing a uniform distribution of the dopant gas into the arc chamber, thereby providing more uniform and stable ion source operation. However, due to excessive source operation and the fact that these liners are thermally isolated from the walls of the arc chamber, the liners may become overheated. As a result, excessive sputtering and/or chemical etching causes particle generations which stick or deposit on the liners.

These same IHC ion sources may also be used for high-current (e.g. >100 mA extraction current) phosphorus implantations which require that the IHC ion source run at cooler-than-normal source temperatures to improve beam current and provide more stable implant profiles. Operating the IHC on source at cooler-than-normal source temperatures also improves fractionization of the phosphorus ion species. However, the particles generated from the excessive sputtering and/or chemical etching may cause unstable ion source operation and beam extraction thereby compromising the desired beam profile. One alternative to overcome these problems is to utilize the source chamber without the liners, thereby making the source chamber somewhat cooler by eliminating thermally isolated hot spots. However, these thicker walls do not provide temperature-control capability for high current and high throughput operations. Thus, there is a need for an ion source that can be operated at a desired temperature for stable, high throughput ion implantations. In addition, there is a need to control the temperature of an ion source chamber by utilizing a gas interface between a cooling plate and an ion source chamber.

SUMMARY OF THE INVENTION

Exemplary embodiments of the present invention are directed to an apparatus and method for controlling the temperature of an ion source within an ion implanter. In an exemplary embodiment, an ion source includes an arc chamber defined by a chamber wall and a plate contiguous with a side of the chamber wall. An interface defined between the plate and the side of the chamber wall receives a gas supplied to the interface at a desired pressure inducing thermal conductance from the interface to the chamber wall to control the temperature of the chamber.

In an exemplary method for controlling the temperature of an ion source chamber, a dopant gas is supplied into the ion source chamber. The dopant gas collides with electrons confined within the chamber to generate plasma having desired properties. A cooling gas is supplied into an interface defined between a wall of the ion source chamber and a cooling plate. Thermal conductance from the interface to the chamber based on a pressure of the cooling gas within the interface is used to control the temperature of the chamber.

DESCRIPTION OF EMBODIMENTS

Figure 1:
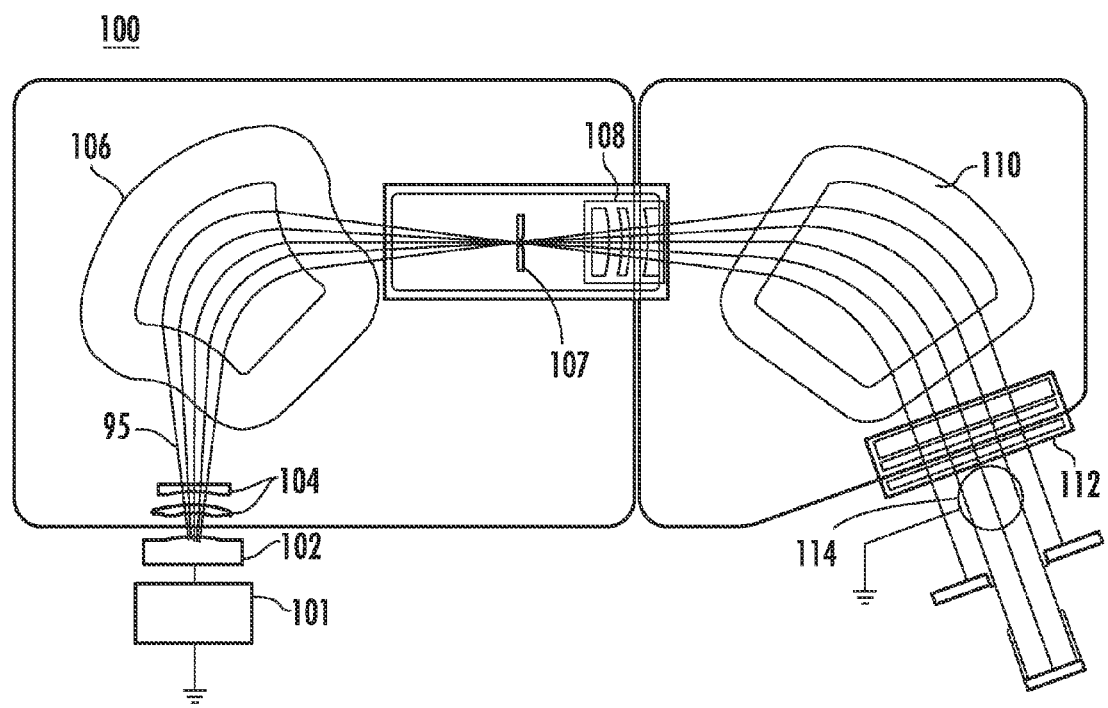
FIG. 1 illustrates a block diagram of a representative ion implanter.
Figure 2:
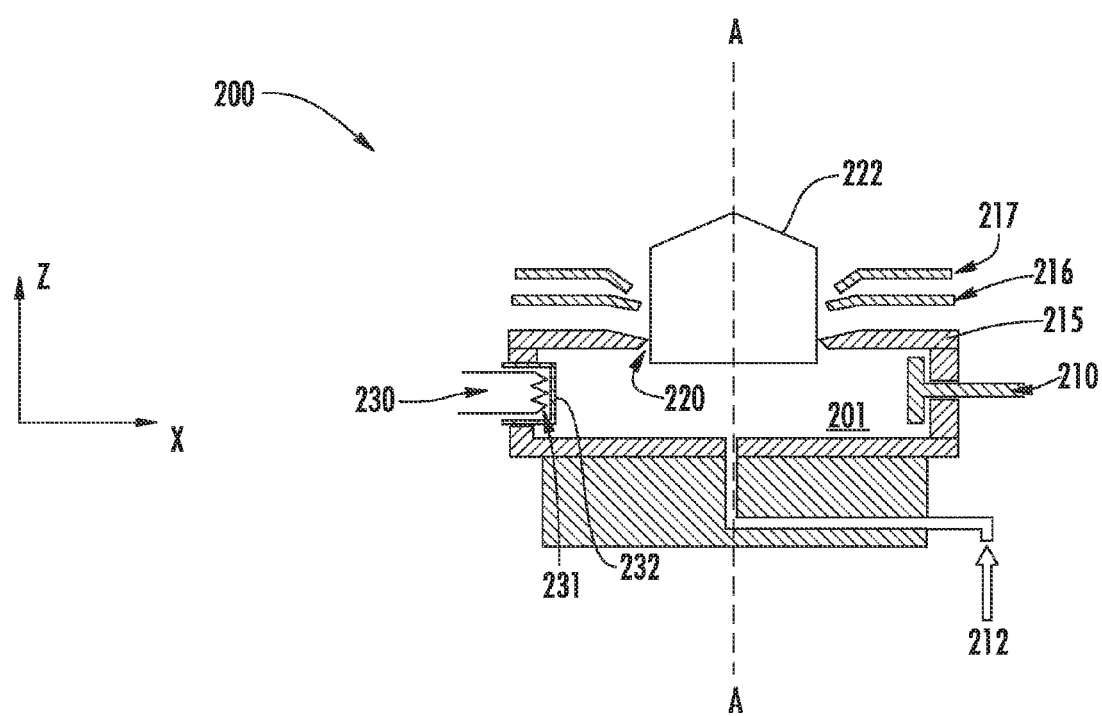
FIG. 2 is a cross sectional block diagram of a prior art ion source.
Figure 2A:
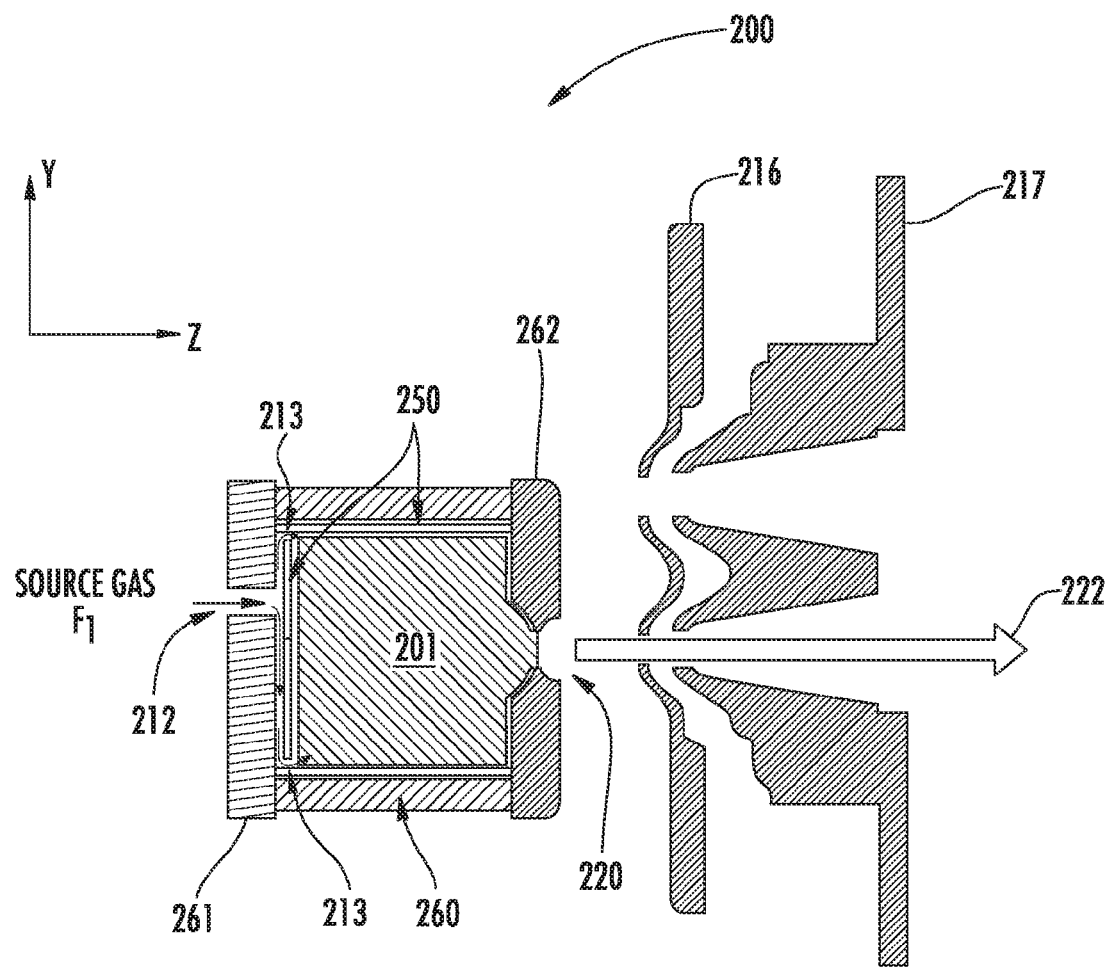
FIG. 2A is a cross section of ion source taken along lines A-A in FIG. 2.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
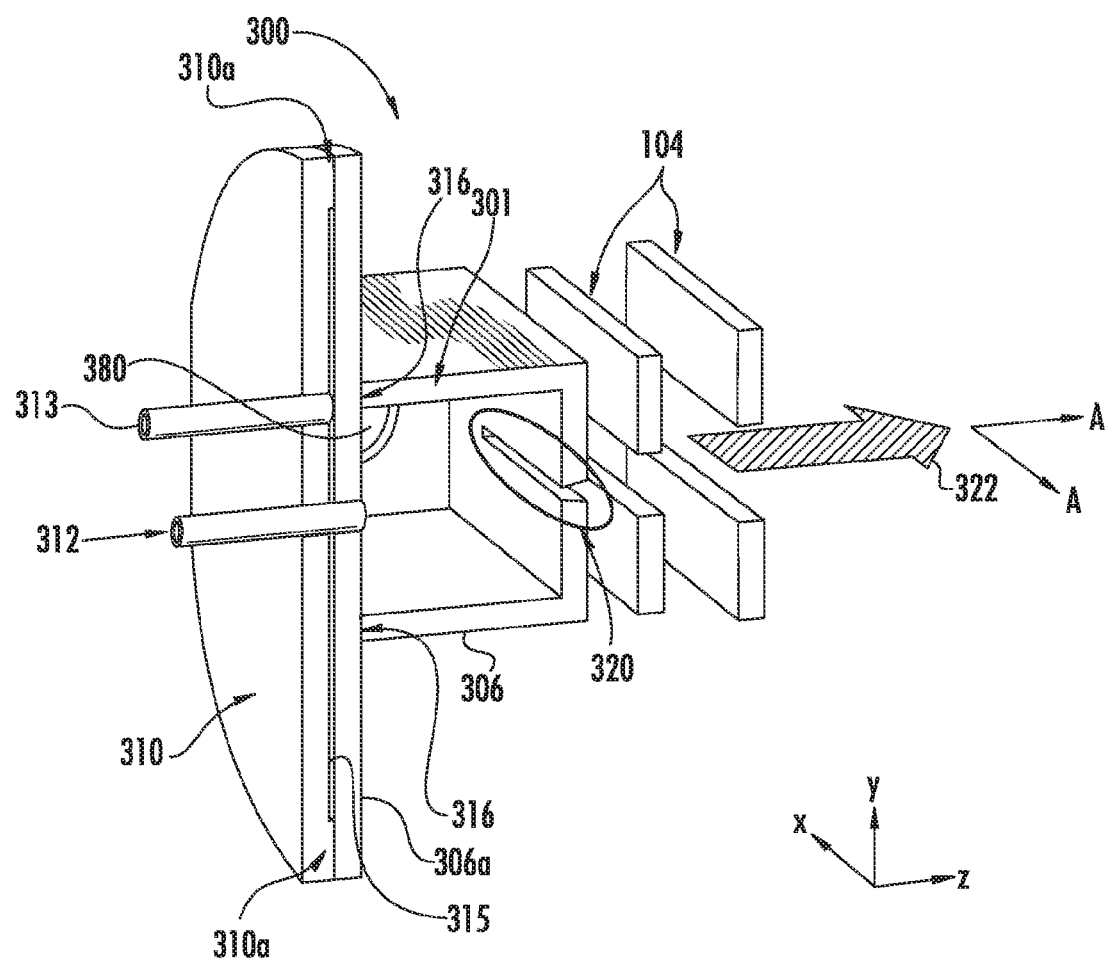
FIG. 3 is a block diagram of an exemplary ion source in accordance with an embodiment of the present disclosure.

FIG. 3 illustrates a sectional view of ion source chamber 300 utilized in an ion implanter 100 shown in FIG. 1. The ion source chamber 300 utilizes a gas interface between a cooling plate and the ion source chamber. A gas, different from the dopant gas, is supplied to this interface to control the temperature of the chamber wall during high throughput operations. In particular, ion source chamber 300 may be an Indirectly Heated Cathode (IHC) ion source typically used for high current ion implantation applications. The ion source chamber 300 includes single-body arc chamber 301 defined by both thermally and electrically conductive wall 306. A dopant gas is supplied to chamber 301 via conduit 312. Chamber 300 includes an aperture 380 for a cathode and an aperture on an opposite end (not shown) for a repeller. The dopant gas supplied to the chamber 301 collides with electrons confined between the cathode and the repeller to generate plasma having desired properties. The generated ions are extracted from the source via aperture 320 by a series of electrodes 104 (e.g. extraction electrode assembly) and formed into a beam 322 for downstream implantation to a target substrate.

The arc chamber 301 may be a single body chamber having wall 306 made from a refractory material. The refractory material makes it difficult to provide a direct (i.e. passages within the body of the wall) cooling path through the wall of the chamber. Thus, the single body design is preferred to maximize the thermal conductance throughout the chamber wall to control the temperature of the chamber more effectively by minimizing the temperature gradient within the chamber 301. In particular, a portion 306a of wall 306 connects the arc chamber 301 to cooling plate 310 via gas interface 315. The gas interface 315 is defined by a gap between cooling plate 310 and chamber wall portion 306a. A cooling gas is supplied to the interface 315 via conduit 313. The physical gap may be, for example, 10-50 microns which is typically sufficient to distribute gas uniformly within the interface 315 and to provide adequate thermal conductance between the cooling plate 310 and chamber wall 306a. In this manner, cooling plate 310 is maintained at a constant temperature using various cooling techniques (e.g. water cooling), while the temperature of chamber wall 206 may vary depending on source operating conditions. Alternatively, chamber 301 may be defined in two parts. The first part being wall portion 306a and the second part being the remainder of wall 306. The two parts may be connected via break lines 316 using fasteners that provide sufficient thermal conductivity between the first and second parts of the arc chamber 301.

A cooling gas such as, for example, Helium, Nitrogen, etc., is supplied to cooling plate 310 via conduit 313. The cooling plate may be, for example, aluminum with a cooling gap or path machined on the surface thereof. In particular, the side of the cooling plate 310 that is contiguous with wall portion 306a includes machined pockets configured to receive cooling gas. The machined pockets may be approximately 20-100 microns. The perimeter of cooling plate 310 forms a seal 310a with wall portion 306a to retain the cooling gas within the gap 315.

In operation, cooling plate 310 receives a cooling gas which provides a uniform distribution of heat conductance from the cooling plate to chamber wall portion 306a and consequently to the remaining portions of wall 306 since the chamber is a single body design. The pressure of the cooling gas within gap 315 determines the thermal conductance to chamber wall portion 306a and consequently the chamber 301. For example, with a gap distance of approximately 10-50 microns, the pressure within the gas cooling interface 315 may be, for example, 1-20 Torr. By regulating the pressure of the cooling gas in the interface, the temperature of the source chamber 301 can be controlled.

Figure 3A:
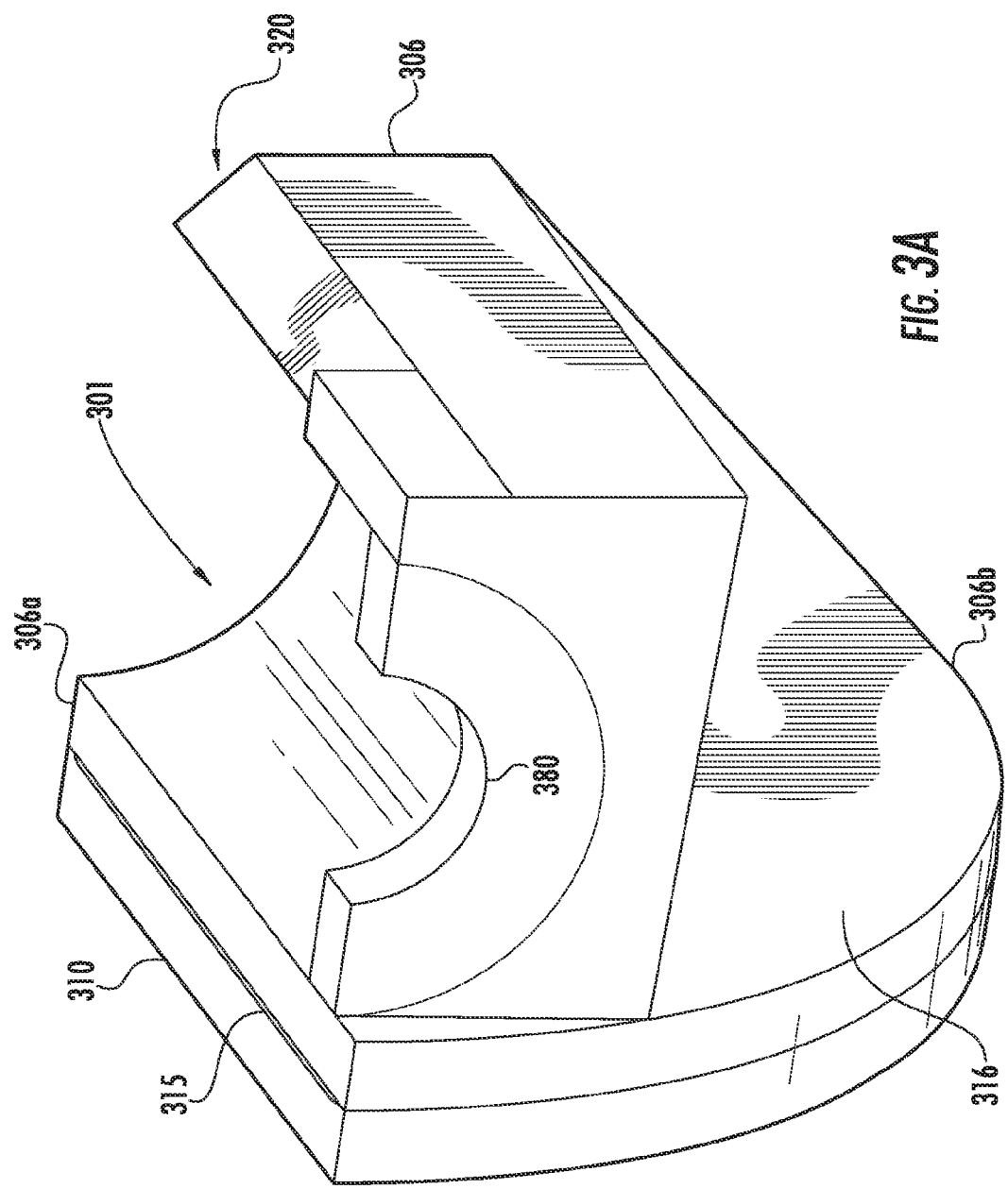
FIG. 3A is a sectional view taken in directions A-A through the ion source chamber shown in FIG. 3.

FIG. 3A is a sectional view taken in directions A-A through the ion source chamber 300 shown in FIG. 3. Chamber wall 306 defines arc chamber 301 having an aperture 380 to receive a cathode and aperture 320 through which ions having a desired species are extracted. As can be seen, the chamber wall is an integrally formed one piece body where cooling plate 310 is contiguous with wall portion 306a. This provides adequate thermal conductance to control the temperature of the chamber. A bottom plate portion 316 is disposed between cooling plate 310 and chamber walls 306. In addition, the interface 315 provides a gap which physically separates the cooling plate 310 from chamber wall 306a. Cooling plate 310 and wall portion 306a have comparable size and corresponding surface area to provide thermal conductance there between via gap interface 315. The internal surface 301a of arc chamber 301 is shown as having a given radius of curvature. However, alternative configurations of the chamber 301 are also within the scope of this disclosure. These various configurations maximize the thermal conductance through the chamber walls 306 from gap interface 315.

Figure 4:
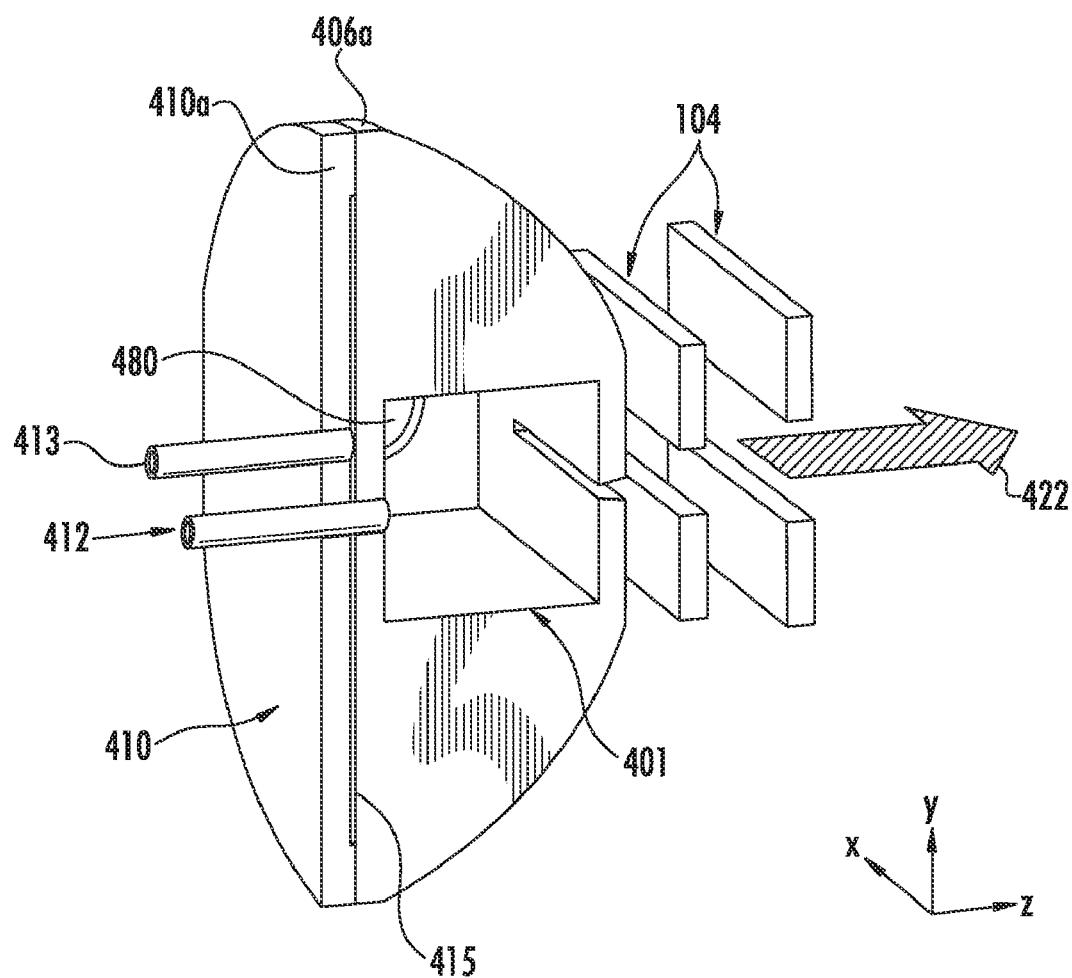
FIG. 4 is a block diagram of an exemplary ion source in accordance with an embodiment of the present disclosure.

FIG. 4 is a sectional view of alternative configuration of an ion source chamber 400 utilized in an ion implanter 100 shown in FIG. 1. Similar to the ion source chamber shown in FIG. 3, ion source chamber 400 includes arc chamber 401 and a cooling plate 410. The interior of the arc chamber 401 is defined by a unitary body structure having conductive wall 406. The cooling plate 410 is contiguous with a portion 406a of wall 406 to define a gas cooling interface 415 in the form of a gap. Arc chamber 400 includes an aperture 480 for the cathode and an aperture on an opposite end (not shown) for the repeller. A dopant gas is supplied to chamber 401 via conduit 412 which collides with electrons confined between the cathode and the repeller to generate plasma having desired properties. The generated ions are extracted from the source via aperture 420 by a series of electrodes 104 (extraction electrode assembly) and formed into a beam 422 for downstream implantation to a target substrate.

Arc chamber 401 defined by conductive wall 406 has a different shape as compared to the chamber 301 shown in FIG. 3. In particular, wall 406 is thicker and has a shape to maximize the thermal conductance through the chamber wall material. In particular, wall portion 406a acts as the interface to the rest of chamber 401 from cooling plate 410 via the gas cooling interface 415. The gas interface 415 is defined by the gap formed between cooling plate 410 and chamber wall portion 406a.

In operation, cooling plate 410 receives a coolant gas via conduit 413 which provides a uniform distribution of heat conductance from the cooling plate to chamber wall portion 406a and consequently to the rest of wall 406 of chamber 401 since the chamber is a single body design. The cooling gas can be, for example, Helium, Nitrogen, etc. The cooling plate 410 may be, for example, aluminum with pockets machined on the surface thereof to retain the cooling gas between wall portion 406a and plate 410. The perimeter of cooling plate 410 is configured to form a seal 410a with chamber wall portion 406a to retain the cooling gas within the gap interface 415. The pressure of the cooling gas within gap 415 determines the thermal conductance to chamber wall portion 406a and consequently controls the temperature of chamber 401.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An arc discharge ion source comprising:
an arc chamber defined by a chamber wall;
a cooling plate proximate to at least an outer side of said chamber wall defining a physical gap between said cooling plate and said chamber wall; and
a gas supplied to said gap at a desired gas pressure to control thermal conductance between the chamber wall and the cooling plate so as to regulate the temperature of the arc chamber during ion source operation.

2. The ion source of claim 1 further comprising a conduit configured to supply dopant gas to an interior of said arc chamber.

3. The ion source of claim 1 wherein said physical gap is defined by a machined surface of said cooling plate.

4. The ion source of claim 1 wherein said chamber wall is a unitary piece of thermally and electrically conductive material.

5. The ion source of claim 2 wherein the gas supplied to said gap and the dopant gas are different gases.

6. The ion source of claim 3 wherein a perimeter of said cooling plate forms a seal with a perimeter of said side of said chamber wall to retain said gas within said gap.

7. The ion source of claim 2 further comprising an indirectly heated cathode located at a first end of said chamber configured to emit electrons within said chamber.

8. The ion source of claim 7 further comprising a repeller located within a second end of said chamber, said emitted electrons confined between said cathode and said repeller which collide with said dopant gas supplied to the interior of said chamber to generate plasma therein.

9. The ion source of claim 8 wherein said chamber further comprising an aperture through which ions from said plasma are extracted.

10. A method for controlling a temperature of an ion source chamber comprising:
supplying a dopant gas into said ion source chamber wherein said dopant gas collides with electrons confined within said chamber to generate plasma having desired properties;
supplying a cooling gas into an interface, said interface defining a physical gap between a wall of said ion source chamber and a plate; and
inducing thermal conductance from said interface to said chamber based on a pressure of said, cooling gas within said interface.

11. The method of claim 10 further comprising regulating the pressure of said cooling gas within said interface.

12. An ion source comprising:
an arc chamber defined by a first unitary chamber wall and a second chamber wall, said first unitary chamber wall sealingly connected to a first side of said second chamber wall;
a cooling plate contiguous with a second side of said second chamber wall, said second side opposite said first side;
an interface gap defined between said cooling plate and said second side of said second chamber wall; and
a cooling gas supplied to said interface gap inducing thermal conductance from said interface gap to said second chamber wall and said first chamber wall to regulate the temperature of said chamber.

13. The ion source of claim 12 further comprising a conduit configured to supply dopant gas to an interior of said arc chamber.

14. The ion source of claim 12 wherein said cooling gas within said interface has a particular pressure based on a size of said interface gap.

15. The ion source of claim 12 wherein said first and second chamber walls are made from an electrically and thermally conductive material.

16. The ion source of claim 14 wherein a perimeter of said cooling plate forms a seal with a perimeter of said second side of said second chamber wall to retain said cooling gas within said interface gap.

17. The ion source of claim 13 further comprising an indirectly heated cathode located at a first end of said chamber configured to emit electrons within said chamber.

18. The ion source of claim 17 further comprising a repeller located within a second end of said chamber, said emitted electrons confined between said cathode and said repeller which collide with said dopant gas supplied to the interior of said chamber to generate plasma therein.

19. The ion source of claim 18 wherein said chamber further comprising an aperture through which ions from said plasma are extracted.

* * * * *